(12) United States Patent
Hata et al.

(10) Patent No.: US 9,584,114 B2
(45) Date of Patent: Feb. 28, 2017

(54) SEMICONDUCTOR SWITCH

(71) Applicant: ADVANTEST CORPORATION, Tokyo (JP)

(72) Inventors: Yoshiyuki Hata, Tokyo (JP); Taku Sato, Tokyo (JP); Masahiko Takikawa, Tokyo (JP)

(73) Assignee: ADVANTEST CORPORATION (JP)

( * ) Notice: Subject to any disclaimer, the term of this patent is extended or adjusted under 35 U.S.C. 154(b) by 70 days.

(21) Appl. No.: 14/729,055

(22) Filed: Jun. 3, 2015

(65) Prior Publication Data
US 2016/0020765 A1  Jan. 21, 2016

(30) Foreign Application Priority Data
Jul. 16, 2014 (JP) ................................ 2014-146017

(51) Int. Cl.
*H03B 1/00* (2006.01)
*H03K 3/00* (2006.01)
*H03K 17/687* (2006.01)
*H03K 17/18* (2006.01)

(52) U.S. Cl.
CPC ............ *H03K 17/687* (2013.01); *H03K 17/18* (2013.01)

(58) Field of Classification Search
USPC .................................................. 327/108–112
See application file for complete search history.

(56) References Cited

U.S. PATENT DOCUMENTS

| 6,084,457 | A  | * | 7/2000 | Parkhurst | H03K 5/08 326/23 |
| 2012/0032714 | A1 | * | 2/2012 | Shimazaki | H03K 17/04123 327/109 |
| 2015/0102672 | A1 | * | 4/2015 | Matsumoto | H02M 1/08 307/31 |
| 2016/0020765 | A1 | * | 1/2016 | Hata | H03K 17/18 327/109 |

* cited by examiner

*Primary Examiner* — Adam Houston
(74) *Attorney, Agent, or Firm* — Cantor Colburn LLP

(57) ABSTRACT

A semiconductor switch is configured to conduct or cutoff a signal path from its first terminal to its second terminal. An enhancement-type first transistor is arranged between the first terminal and the second terminal. A first bias circuit is connected to apply a gate voltage $V_G$ that corresponds to a control signal $V_{CNT}$ to the gate of the first transistor when the power supply voltages $V_{DD}$ and $V_{SS}$ are supplied. A second bias circuit is connected such that a voltage that corresponds to the lower voltage of the voltages at the first terminal and the second terminal is applied to the gate of the first transistor when the power supply voltages $V_{DD}$ and $V_{SS}$ are not supplied.

8 Claims, 6 Drawing Sheets

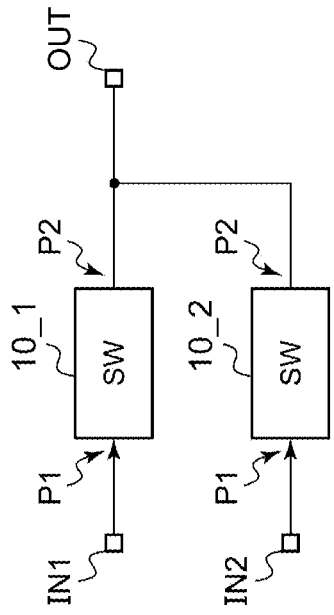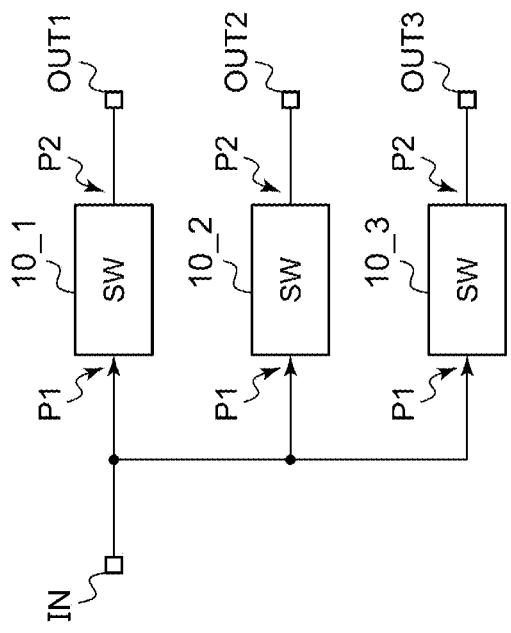
FIG.7B
FIG.7A

SEMICONDUCTOR SWITCH

CROSS-REFERENCE TO RELATED APPLICATION

This application claims the priority of Japanese Patent Application No. 2014-146017, filed on Jul. 16, 2014 in the Japanese Property Office, the disclosure of which is incorporated in its entirety herein by reference.

BACKGROUND OF THE INVENTION

1. Field of the Invention

The present invention relates to a semiconductor switch.

2. Description of the Related Art

In order to test whether or not a semiconductor device operates normally, or in order to identify defective parts, a semiconductor test apparatus (which will be referred to simply as the "test apparatus", or otherwise as the "ATE: Automatic Test Equipment") is employed. Typically, such a test apparatus provides an AC test and a DC test.

In the AC test, a test pattern is generated by means of a pattern generator and a timing generator. Furthermore, a driver generates a pattern signal (test signal) that corresponds to the test pattern, and supplies the pattern signal thus generated to a device under test (DUT). Upon reception of the pattern signal, the DUT performs predetermined signal processing, and outputs an output signal to the test apparatus. By means of a timing comparator, the test apparatus judges the signal level received from the DUT. By comparing the judgment result with an expected value, the test apparatus judges the quality of the functions of the DUT.

In the DC test operation, a DC test unit supplies a DC voltage or a current signal to the DUT, and the test apparatus tests the DC characteristics such as the input/output impedance of the DUT, the leak current thereof, and so forth.

In many cases, a driver, a timing comparator, and a PMU configured to perform a DC test operation are arranged on a board which is referred to as a pin card (pin electronics card), a digital module, or an interface card, and which is configured such that the board can be removed from the main unit of the test apparatus.

FIG. 1 is a diagram showing a typical configuration of such a pin card. FIG. 1 shows only one channel that corresponds to a given device pin. In practice, several hundreds through several thousands of channels are arranged in parallel.

An I/O terminal Pio of a pin card 200 is connected to a corresponding device pin of a DUT 1 via a cable and an unshown device chuck. The pin card 200 includes two switches (relays) SW1 and SW2, in addition to a driver DR, a timing comparator TCP, and a DC test unit PMU. The switches SW1 and SW2 are used to switch the test mode between the AC test mode and the DC test mode.

When the AC test operation is performed, the switch SW1 is turned on and the switch SW2 is turned off. In this state, the driver DR and the timing comparator TCP are connected to the DUT 1, and the DC test unit PMU is disconnected from the DUT 1.

Conversely, when the DC test operation is performed, the switch SW1 is turned off and the switch SW2 is turned on. In this state, the driver DR and the timing comparator TCP are disconnected from the DUT 1, and the DC test unit PMU is connected to the DUT 1.

In many cases, such a switch SW is configured as a semiconductor switch instead of being configured as a mechanical relay. FIG. 2 is a circuit diagram showing a semiconductor switch 80 investigated by the present inventors. The semiconductor switch 80 includes a transistor 82 and a bias circuit 84 that controls the voltage of a control electrode (gate) of the transistor 82. The transistor 82 is configured as an enhancement-type N-channel transistor. For example, the transistor 82 is configured as a MIS-HEMT (Metal Insulator Semiconductor-High Electron Mobility Transistor).

FIGS. 3A and 3B are diagrams each showing an example of the current/voltage characteristics of such a HEMT. The HEMT has a control electrode (gate) G, a first electrode E1, and a second electrode E2. Of the two electrodes, i.e., the first electrode and the second electrode, the electrode that is set to a higher electric potential will be referred to as the "drain D", and the electrode that is set to a lower electric potential will be referred to as the "source". The HEMT is configured as a device that is capable of controlling the on/off state of the drain/source current. When the gate/source voltage of the HEMT exceeds a predetermined threshold value $V_{TH}$, the HEMT is turned on. FIG. 3A shows the current/voltage characteristics of a HEMT in a case in which it is configured as an enhancement-type HEMT. FIG. 3B is the current/voltage characteristics of a HEMT in a case in which it is configured as a depression-type HEMT.

Description will be made returning to FIG. 2. The bias circuit 84 receives the power supply voltages $V_{DD}$ and $V_{SS}$, and controls the gate/source voltage $V_{GS}$ of the transistor 82 according to a control signal $V_{CNT}$ which is an instruction to turn on or otherwise turn off the transistor 82.

Specifically, when the control signal $V_{CNT}$ is set to a first level (e.g., high level), the bias circuit 84 applies, as the gate/source voltage of the transistor 82, a voltage that is higher than the threshold voltage $V_{TH}$. When the control signal $V_{CNT}$ is set to a second level (e.g., low level), the bias circuit 84 applies, as the gate/source voltage of the transistor 82, a voltage (e.g., 0 V) that is lower than the threshold voltage $V_{TH}$.

When the power supply voltages $V_{DD}$ and $V_{SS}$ are normally supplied to the bias circuit 84, the bias circuit 84 is capable of appropriately turning on and off the transistor 82 according to the control signal $V_{CNT}$. However, when the power supply voltages $V_{DD}$ and $V_{SS}$ are not supplied (which will be referred to as the "no-power-supply state"), the output of the bias circuit 84 is set to a high-impedance state. In this state, the output voltage of the bias circuit 84, i.e., the gate voltage $V_G$ of the transistor 82, is fixedly set to 0 V (ground voltage) (or otherwise set to an indefinite value).

Description will be made regarding the semiconductor switch 80 shown in FIG. 2 assuming that the output terminal P2 is set to 0 V, a variable voltage $V_{IN}$ is input to the input terminal P1, and the HEMI has a threshold voltage $V_{TH}$ of 1 V.

When $V_{IN}$>0 V (e.g., $V_{IN}$=5 V), the electric potential (5 V) at the first electrode E1 is higher than the electric potential (0 V) at the second electrode E2. In this state, the first electrode E1 functions as a drain, and the second electrode E2 functions as a source. In this case, $V_{GS}$, which is represented by $V_{GS}=V_G-V_S$, is 0 V, and accordingly, $V_{as}$ is lower than $V_{TH}$. Thus, the transistor 82 is turned off.

Conversely, when $V_{IN}$<0 V (e.g., $V_{IN}$=−5 V), the electric potential (−5 V) at the first electrode E1 is lower than the electric potential (0 V) at the second electrode E2. In this state, the first electrode E1 functions as a source, and the second electrode E2 functions as a drain. In this case, $V_{GS}$, which is represented by $V_{GS}=V_G-V_S$, is 5 V, and accordingly, $V_{GS}$>$V_{TH}$ holds true. Thus, the transistor 82 is turned on.

As described above, with the semiconductor switch 80 shown in FIG. 2, in the no-power-supply state, the on/off state depends on the electric potentials at the input terminal P1 and the output terminal P2, leading to instability of the on/off state. However, with the pin card 200 shown in FIG. 1, in the no-power-supply state, the switches SW1 and SW2 are preferably turned off. In addition to such a pin card 200, there are various kinds of known switches required to be turned off in the no-power-supply state.

SUMMARY OF THE INVENTION

The present invention has been made in view of such a situation. Accordingly, it is an exemplary purpose of an embodiment of the present invention to provide a semiconductor switch that turns on in a sure manner in the no-power-supply state.

An embodiment of the present invention relates to a semiconductor switch having its first terminal and its second terminal, and configured to conduct or cutoff a signal path from its first terminal to its second terminal. The semiconductor switch comprises: an enhancement-type first transistor arranged between the first terminal and the second terminal; a first bias circuit connected to apply a gate voltage that corresponds to a control signal to a gate of the first transistor when a power supply voltage is supplied; and a second bias circuit connected to apply, to the gate of the first transistor, a voltage that corresponds to a lower voltage selected from among voltages at the first terminal and the second terminal, in a no-power-supply state in which the power supply voltage is not supplied.

In the no-power-supply state, such an embodiment is capable of ensuring that the gate-source voltage of the first transistor is lower than the threshold voltage of the first transistor regardless of the high-level/low-level relation between the voltages at the first terminal and the second terminal. Thus, such an arrangement is capable of turning off the first transistor in a sure manner.

Also, the second bias circuit may comprise: a gate circuit that passes the voltages at the first terminal and the second terminal in the no-power-supply state; and a comparator circuit that applies, to the gate of the first transistor, a voltage that corresponds to a lower voltage selected from among the voltages at the first terminal and the second terminal.

Also, the gate circuit may comprise: a second transistor having its first electrode connected to the first terminal, its second electrode, and its gate biased so as to turn on the second transistor in the no-power-supply state; and a third transistor having its first electrode connected to the second terminal, its second electrode, and its gate biased so as to turn on the third transistor in the no-power-supply state. Also, the comparator circuit may select a lower voltage from among the voltage at the second electrode of the second transistor and the voltage at the second electrode of the third transistor, and may apply a voltage that corresponds to the selected voltage to the gate of the first transistor.

Also, the second transistor and the third transistor may each be configured as a depression-type transistor. Also, the gates of the second transistor and the third transistor may each be connected to a power supply line to which a lower-side power supply voltage is supplied, and may each be connected to a ground line via a resistor.

Also, the comparator circuit may comprise: a first diode having its cathode connected to the second electrode of the second transistor, and its anode connected to the gate of the first transistor; and a second diode having its cathode connected to the second electrode of the third transistor, and its anode connected to the gate of the first transistor.

Also, the first bias circuit may adjust the gate voltage of the first transistor according to the voltage at the first terminal and the voltage at the second terminal.

Also, the first bias circuit may comprise: a tracking circuit that generates a tracking voltage that follows the voltage at the first terminal and the voltage at the second terminal; and a level shifter that shifts the level of the control signal in a binary manner to a high level voltage that corresponds to the tracking voltage or otherwise to a predetermined low level voltage.

Another embodiment of the present invention relates to a semiconductor test apparatus. The semiconductor test apparatus may include any one of the aforementioned semiconductor switches.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 7A and 7B are circuit diagrams each showing a selector including a semiconductor switch.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, a state represented by the phrase "the member A is connected to the member B" includes a state in which the member A is indirectly connected to the member B via another member that does not affect the electric connection therebetween, in addition to a state in which the member A is physically and directly connected to the member B. Similarly, a state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 4:
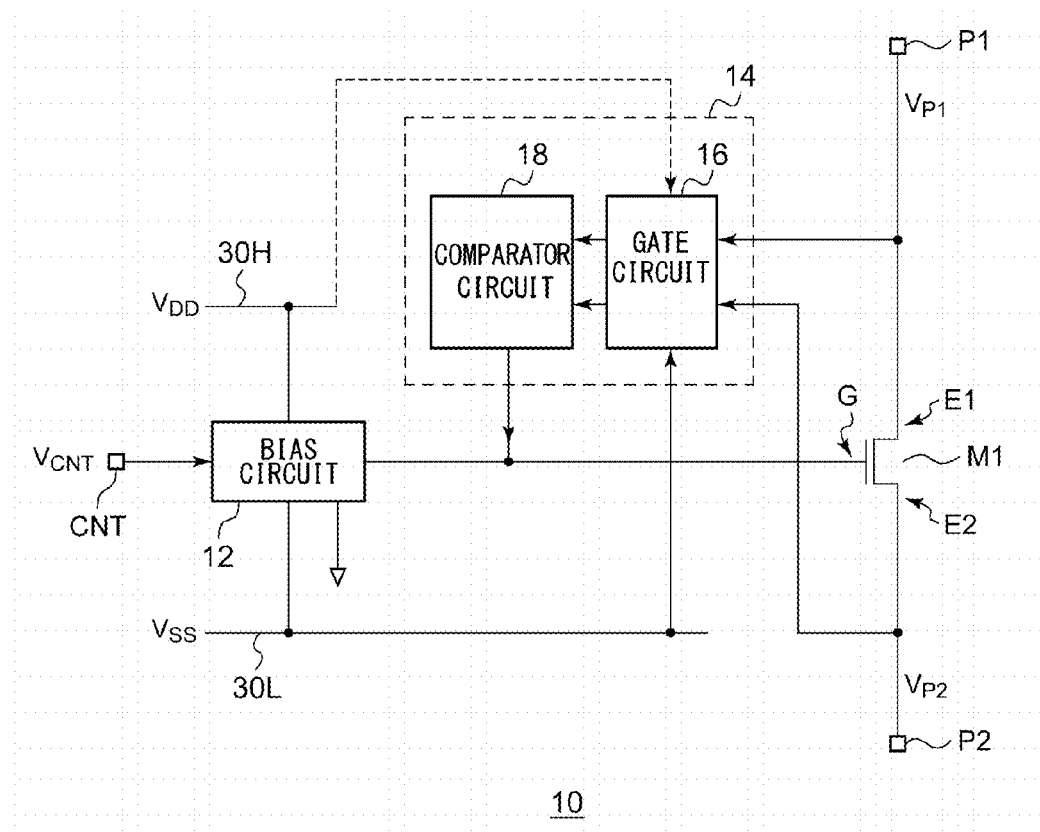
FIG. 4 is a circuit diagram showing a semiconductor switch according to an embodiment.

FIG. 4 is a circuit diagram showing a semiconductor switch 10 according to an embodiment. The semiconductor switch 10 includes a first terminal P1, a second terminal P2, and a control terminal CNT. The semiconductor switch 10 is configured to be capable of switching its state between a conducting state (on state) and a cutoff state (off state) between the first terminal P1 and the second terminal P2, according to the control signal $V_{CNT}$ at the control terminal CNT. The signal to be input to the first terminal or the second terminal may be configured as an AC signal or a DC signal. Also, the signal to be input to the first terminal or the second terminal may be configured as a voltage signal or a current signal. The semiconductor switch 10 is connected to the power supply lines 30H and 30L, which allows the semiconductor switch 10 to receive the supply of the power supply voltages $V_{DD}$ and $V_{SS}$ from an unshown power supply.

The semiconductor switch 10 includes a first transistor M1, a first bias circuit 12, and a second bias circuit 14.

The first transistor M1 is configured as an enhancement-type N-channel transistor, and is arranged between the first terminal P1 and the second terminal P2. Specifically, the first transistor M1 is configured as a MIS-HEMT, and is arranged such that its first terminal E1 is connected to the first terminal P1, and its second terminal E2 is connected to the second terminal P2.

The first bias circuit 12 is configured to be capable of switching the gate voltage $V_G$ of the first transistor M1 in a binary manner between a high level voltage $V_{GH}$ and a low level voltage $V_{GL}$ according to the control signal $V_{CNT}$ when the first bias circuit 12 receives the supply of the power supply voltages $V_{DD}$ and V. When the control signal $V_{CNT}$ is set to the first level (e.g., high level), the first bias circuit 12 outputs the gate voltage $V_{GH}$ at high level. When the control signal $V_{CNT}$ is set to the second level (e.g., low level), the first bias circuit 12 outputs the gate voltage $V_{GL}$ at low level. With the maximum value of the voltages $V_{P1}$ and $V_{P2}$ that can develop at the first terminal P1 and the second terminal P2 as $V_{MAX}$, and with the threshold voltage of the transistor as $V_{TH}$, the high level voltage $V_{GH}$ is determined so as to satisfy the following Expression.

$$V_{GH} > V_{MAX} + V_{TH}.$$

Furthermore, as the low level voltage $V_{GL}$, the ground voltage $V_{GND}$ (=0 V) is employed. In a case in which the power supply voltages $V_{DD}$ and $V_{SS}$ are not supplied, i.e., in the no-power-supply state, the output of the first bias circuit 12 becomes a high-impedance state.

The configuration of the first bias circuit 12 is not restricted in particular. Rather, the first bias circuit 12 may be configured using known techniques. Typically, the first bias circuit 12 can be regarded as a buffer circuit, a level shift circuit, an inverter circuit, or a combination of such circuits.

On the other hand, the second bias circuit 14 is connected to apply, to the gate of the first transistor M1 in the no-power-supply state, a voltage that corresponds to the lower voltage selected from among the voltages $V_{P1}$ and $V_{P2}$ that develop at the first terminal P1 and the second terminal P2.

The second bias circuit 14 includes a gate circuit 16 and a comparator circuit 18.

In the no-power-supply state, the gate circuit 16 passes through the voltages $V_{P1}$ and $V_{P2}$ that respectively develop at the first terminal P1 and the second terminal P2. Description will be made in the first embodiment regarding an arrangement configured to judge, based on the power supply voltage $V_{SS}$, whether or not the no-power-supply state has occurred. However, the present invention is not restricted to such an arrangement. Also, whether or not the no-power-supply state has occurred may be judged based on the power supply voltage $V_{DD}$, instead of or in addition to the power supply voltage $V_{SS}$. That is to say, the gate circuit 16 may preferably be switchable between the conducting state and the cutoff state according to at least one of the power supply voltages $V_{DD}$ and $V_{SS}$.

The comparator circuit 18 applies, to the gate of the first transistor M1, a voltage that corresponds to the lower voltage selected from among the voltages $V_{P1}$ and $V_{P2}$ that develop at the first terminal P1 and the second terminal P2 after they pass through the gate circuit 16.

Figure 5:
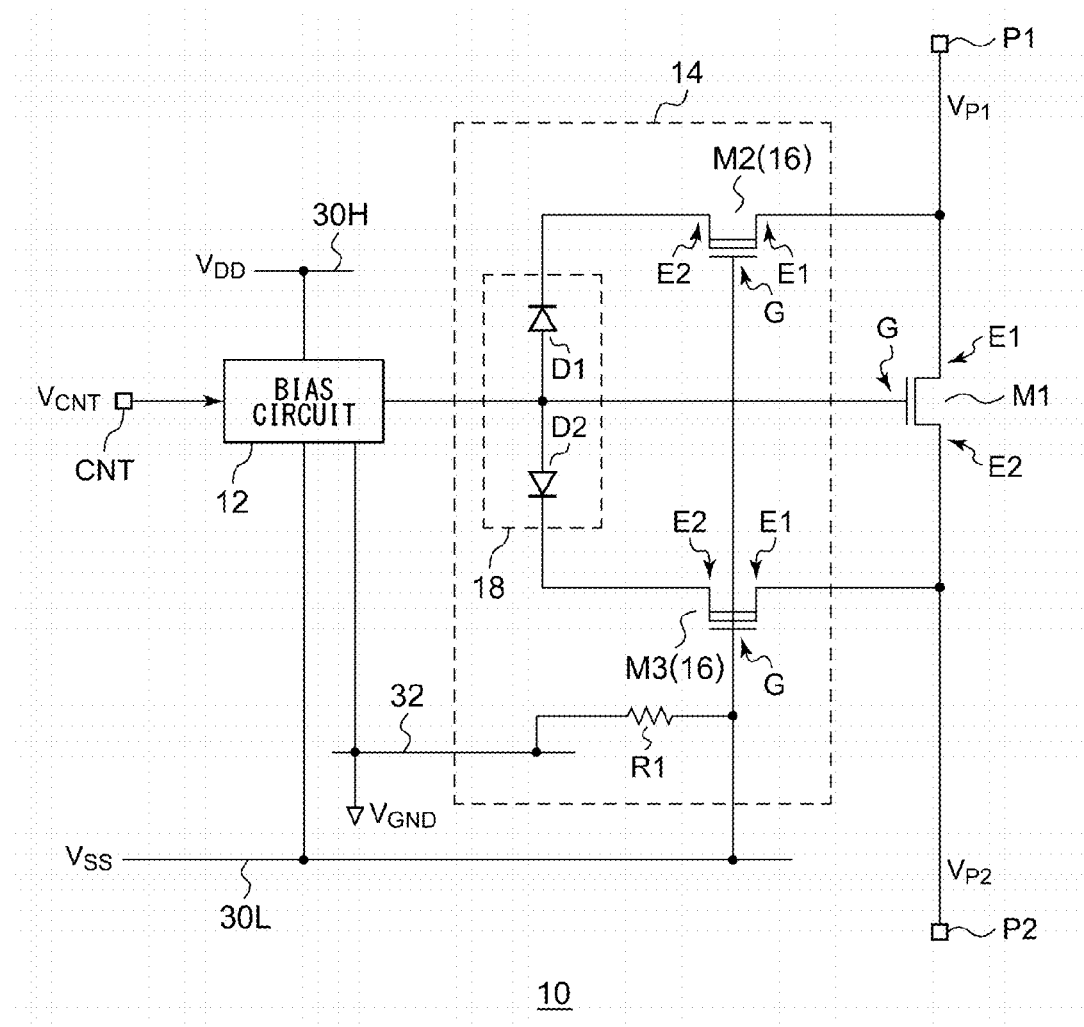
FIG. 5 is a circuit diagram showing a specific configuration of the semiconductor switch.

The above is the basic configuration of the semiconductor switch 10. FIG. 5 is a circuit diagram showing a specific configuration of the semiconductor switch 10. The gate circuit 16 includes a second transistor M2 and a third transistor M3. The first electrode of the second transistor M2 is connected to the first terminal P1. The gate of the second transistor M2 is biased such that the second transistor M2 turns on in the no-power-supply state. The first electrode of the third transistor M3 is connected to the second terminal P2. Furthermore, the gate of the third transistor M3 is biased such that the third transistor M3 turns on in the no-power-supply state.

Figure 3A:
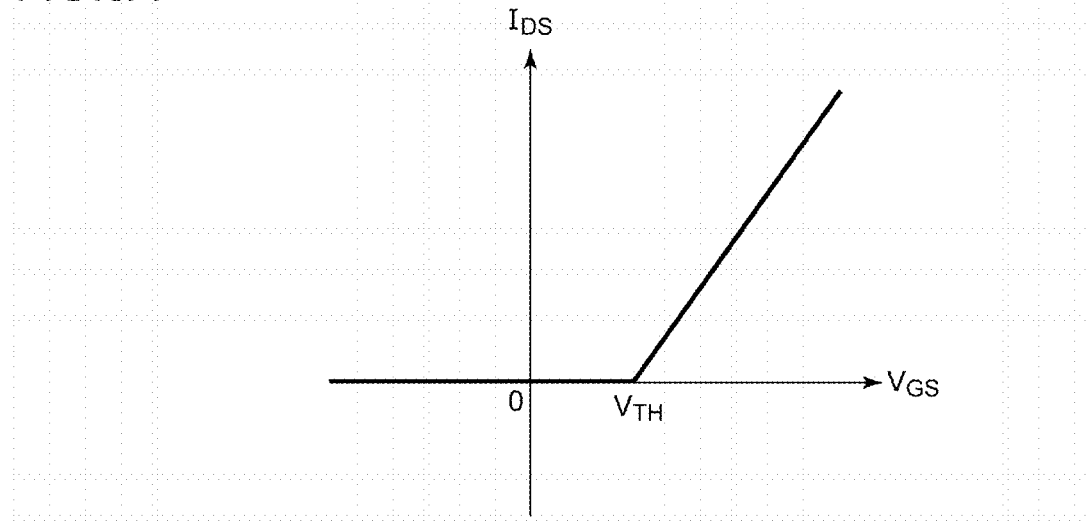
FIGS. 3A and 3B are graphs each showing an example of the current/voltage characteristics of a HEMT.
Figure 3B:
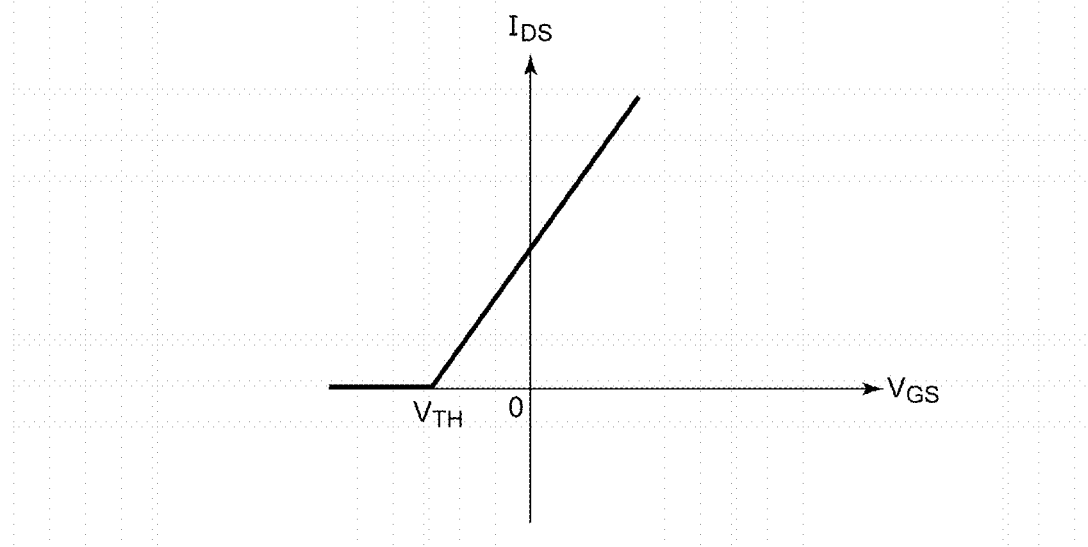

Description will be made regarding the gate biasing for the second transistor M2 and the third transistor M3. The second transistor M2 and the third transistor M3 are each configured as a depression-type transistor having a negative threshold voltage $V_{TH}$ as shown in FIG. 3B.

The second transistor M2 and the third transistor M3 are arranged such that their gates are each connected to a power supply line 30L that receives the supply of a lower-side power supply voltage $V_{SS}$ having a negative value (which is lower than 0). Furthermore, the gates of the second transistor M2 and the third transistor M3 are connected via a resistor R1 to a ground line 32 that receives the supply of the ground voltage $V_{GND}$.

When the lower-side power supply voltage $V_{SS}$ is not supplied, the ground voltage $V_{GND}$ (=0V) is supplied to the gates of the second transistor M2 and the third transistor M3 via the resistor R1. Accordingly, in the no-power-supply state, the condition $V_{GS} > V_{TH}$ is satisfied in the operations of the second transistor M2 and the third transistor M2, thereby turning on the second transistor M2 and the third transistor M3. That is to say, in the no-power-supply state, the voltage at the second electrode E2 of the second transistor M2 is substantially the same as the voltage $V_{P1}$ at the first terminal P1. Furthermore, the voltage at the second electrode E2 of the third transistor M3 is substantially the same as the voltage $V_{P2}$ at the second terminal P2.

Conversely, when the power supply voltage $V_{SS}$ is supplied, the negative voltage $V_{SS}$ is supplied to the gates of the second transistor M2 and the third transistor M3. The lower-side power supply voltage $V_{SS}$ is lower than the threshold voltage $V_{TH}$. Accordingly, in this state, the second transistor M2 and the third transistor M3 are each turned off.

The comparator circuit 18 selects the lower voltage from among the voltage (i.e., $V_{P1}$) at the second electrode E2 of the second transistor M2 and the voltage (i.e., $V_{P2}$) at the second electrode E2 of the third transistor M3, and applies a voltage that corresponds to the voltage thus selected to the gate of the first transistor M1.

The functions of the comparator circuit 18 can be realized by means of a so-called minimum value detection circuit. For example, such a minimum value detection circuit may be configured as a combination of two diodes D1 and D2. That is to say, the cathode of the first diode D1 is connected to the second electrode E2 of the second transistor M2, and the cathode of the second diode D2 is connected to the second electrode E2 of the third transistor M3. Furthermore, the anodes of the first diode D1 and the second diode D2 are each connected to the gate of the first transistor M1. With such an arrangement, the gate voltage $V_G$ of the first transistor M1 is represented by $\min(V_{P1}, V_{P2}) + V_F$. Here, "min( )" represents a function that selects the smaller value. Here, $V_F$ represents the forward voltage of the diode. In a case of employing a silicon diode, such a diode has a forward voltage on the order of 0.6 V.

It should be noted that the configuration of the second bias circuit 14 is not restricted to such an arrangement shown in FIG. 5. Also, various kinds of other circuits having the same functions may be designed, which are conceivable by those skilled in this art.

The above is the configuration of the semiconductor switch 10. Next, description will be made regarding the operations of the semiconductor switch 10, separated into a normal state in which the power supply voltages $V_{DD}$ and $V_{SS}$ are supplied and the no-power-supply state in which the power supply voltages $V_{DD}$ and $V_{SS}$ are not supplied.

[Normal State]

In the normal state, the lower-side power supply voltage $V_{SS}$ (which is lower than $V_{TH}$) is supplied to the gates of the second transistor M2 and the third transistor M3, thereby turning off the second transistor M2 and the third transistor M3. In this state, the output of the second bias circuit 14 is set to the high-impedance state, which has no effect on the gate voltage of the first transistor M1.

In this state, the gate voltage of the first transistor M1 is switched in a binary manner between the high-level voltage $V_{GH}$ and the low-level voltage $V_{GL}$ by the first bias circuit 12. This allows the on/off state of the first transistor M1 to be controlled.

[No-Power-Supply State]

In the no-power-supply state, the output of the first bias circuit 12 becomes the high-impedance state. On the other hand, in the second bias circuit 14, the second transistor M2 and the third transistor M3 are each turned on. In this state, the lower voltage is selected from among the voltages at the first terminal P1 and the second terminal P2.

When $V_{P1} > V_{P2}$, the first transistor M1 operates such that the first electrode E1 functions as a drain and the second electrode E2 functions as a source. Furthermore, the voltage $(V_{P2} + V_F)$, which corresponds to $V_{P2}$, is applied to the gate of the first transistor M1. In this state, the gate-source voltage $V_{GS}$ of the first transistor M1 is represented by $V_{GS} = V_G - V_S = (V_{P2} + V_F) - V_{P2} = V_F$. Thus, the gate-source voltage $V_{GS}$ does not depend on the voltage $V_{P2}$. This state can be regarded as a state in which the gate-source voltage of the first transistor M1 is clamped by the diode. In a case in which $V_F = 0.6$ V, and $V_{TH} = 1$ V, $V_F$ is lower than $V_{TH}$. Thus, the first transistor M1 is turned off regardless of the voltage $V_{P2}$.

Conversely, when $V_{P1} < V_{P2}$, the first transistor M1 operates such that the first electrode E1 functions as a source and the second electrode E2 functions as a drain. Furthermore, the voltage $(V_{P1} + V_F)$, which corresponds to $V_{P1}$, is applied to the gate of the first transistor M1. In this state, the gate-source voltage $V_{GS}$ of the first transistor M1 is represented by $V_{GS} = V_G - V_S = (V_{P1} + V_F) - V_{P1} = V_F$. In this state, $V_F$ is lower than $V_{TH}$, thereby turning off the first transistor M1 regardless of the voltage $V_{P1}$.

The above is the operation of the semiconductor switch 10.

In the normal state, the semiconductor switch 10 is capable of switching on and off the first transistor M1 according to the control voltage $V_{CNT}$. Conversely, in the no-power-supply state, the semiconductor switch 10 is capable of turning off the first transistor M1 in a sure manner regardless of the magnitude relation between the voltages $V_{P1}$ and $V_{P2}$ at the first terminal P1 and the second terminal P2 and the voltage levels of the voltages $V_{P1}$ and $V_{P2}$.

Description has been made regarding the present invention with reference to the embodiment. The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

[First Modification]

Figure 6:
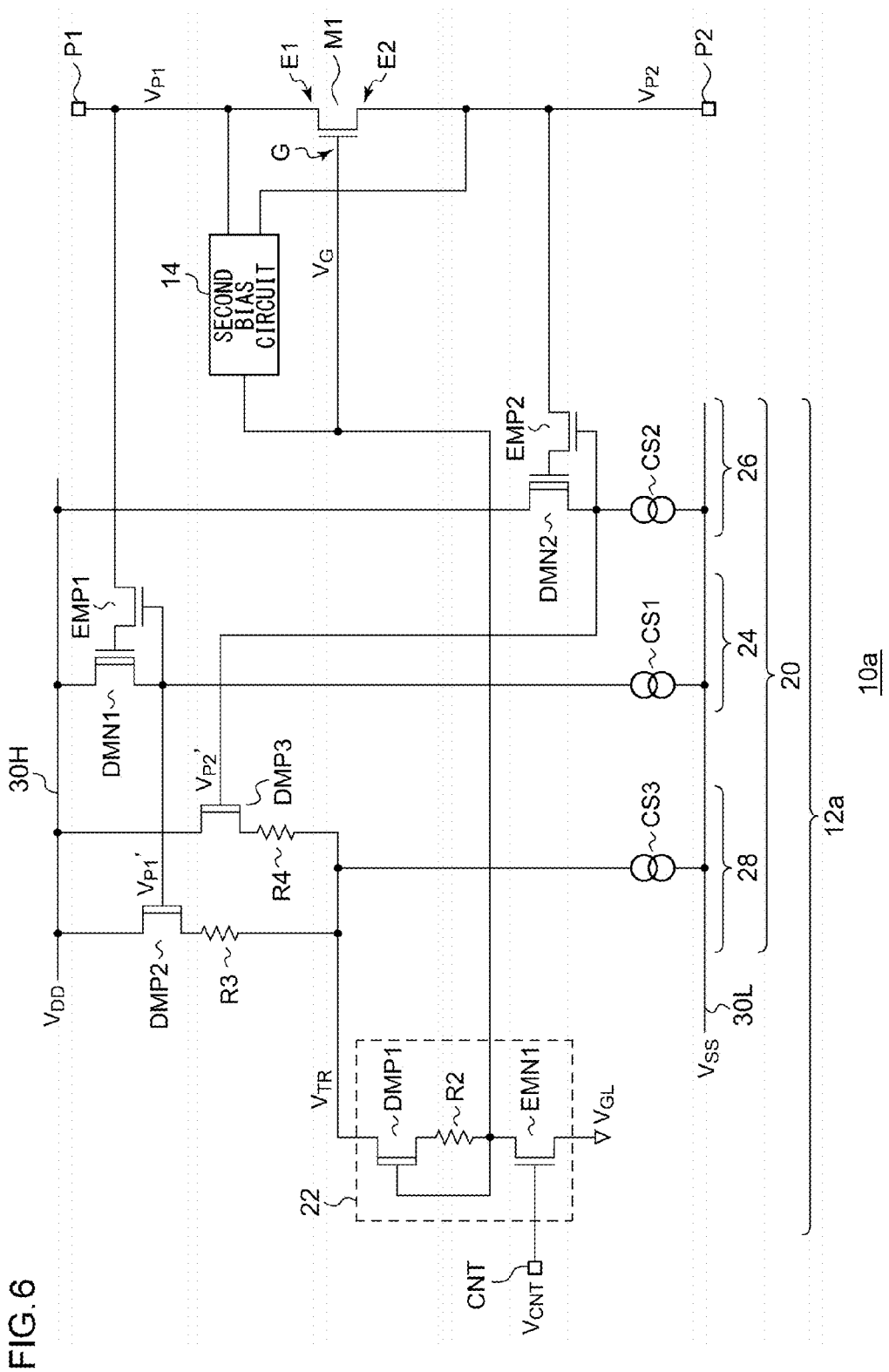
FIG. 6 is a circuit diagram showing a semiconductor switch according to a modification.

FIG. 6 is a circuit diagram showing a semiconductor switch 10a according to a first modification. Description has been made with reference to FIGS. 4 and 5 regarding the semiconductor switch 10, the first bias circuit 12 generates a high level voltage $V_{GH}$ having a predetermined value in the normal state. In contrast, with such a modification shown in FIG. 6, a first bias circuit 12a is configured to be capable of generating a high-level voltage $V_{GH}$ that follows the voltages $V_{P1}$ and $V_{P2}$ at the first terminal P1 and the second terminal P2 (which is referred to as a "tracking function").

The first bias circuit 12a includes a tracking circuit 20 and a level shifter 22.

The tracking circuit 20 generates a tracking voltage $V_{TR}$ that follows the voltage $V_{P1}$ at the first terminal P1 and the voltage $V_{P2}$ at the second terminal P2. A test apparatus 2 shifts the level of the control signal $V_{CNT}$ in a binary manner to the high-level voltage $V_{GH}$ that corresponds to the tracking voltage $V_{TR}$ or otherwise to the predetermined low-level voltage $V_{GL}$.

The level shifter 22 shown in FIG. 6 includes a depression-type P-channel transistor DMP1, an enhancement-type N-channel transistor EMN1, and a resistor R2, connected in series. The transistor DMP1 is arranged such that its gate and drain are connected to each other (diode connection). When the control signal $V_{CNT}$ is set to high level, the transistor EMN1 is turned on. In this state, the output of the level shifter 22, i.e., the gate voltage $V_G$ of the first transistor M1, is set to the low-level voltage $V_{GL}$. When the control signal $V_{CNT}$ is set to low level, the transistor EMN1 is turned off. In this state, the output voltage $V_G$ of the level shifter 22 is set to the high-level voltage $V_G$ that corresponds to the tracking voltage $V_{TR}$.

It should be noted that the level shifter 22 may be configured as a known circuit such as a CMOS (Complementary Metal Oxide Semiconductor) type inverter or the like.

The tracking circuit 20 includes a first source follower 24, a second source follower 26, and an output buffer 28.

The first source follower 24 outputs a voltage $V_{P1}'$ that corresponds to the voltage $V_{P1}$ at the first terminal P1. The first source follower 24 includes a depression-type N-channel transistor DMN1, a current source CS1, and an enhancement-type N-channel transistor EMP1. The voltage $V_{P1}$ at the first terminal P1 is input to the gate of the transistor DMN1. Furthermore, the source of the transistor DMN1 is connected to the current source CS1 that functions as a load. The transistor EMP1 is configured as a protection transistor that prevents a large current from flowing to the gate of the transistor DMN1 when overvoltage occurs in the voltage $V_{P1}$.

The second source follower 26 has the same configuration as that of the first source follower 24. The second source follower 26 outputs a voltage $V_{P2}'$ that corresponds to the voltage $V_{P2}$ at the second terminal P2. The output buffer 28 selects the lower voltage from among the voltages $V_{P1}'$ and $V_{P2}'$, and outputs the tracking voltage $V_{TR}$ that corresponds to the voltage thus selected. For example, the output buffer 28 includes depression-type P-channel transistors DMP2 and DMP3, resistors R3 and R4, and a current source CS3.

The above is the configuration of the semiconductor switch 10a according to the modification. With the semiconductor switch 10a, in the normal operation, the high-level voltage $V_{GH}$ changes according to the lower voltage selected from among the voltages $V_{P1}$ and $V_{P2}$ at the first terminal P1 and the second terminal P2. This extends the range in which the gate-source voltage of the first transistor M1 is maintained at a constant level, thereby extending the range in which the on resistance is maintained at a constant level.

[Second Modification]

The first transistor M1 and other transistors may each be configured as a MOSFET (Metal Oxide Semiconductor Field Effect Transistor) or the like. Also, the kind of transistor may each be selected based on the specifications required for the semiconductor switch, e.g., based on the passband or the like.

[Usage]

Figure 1:
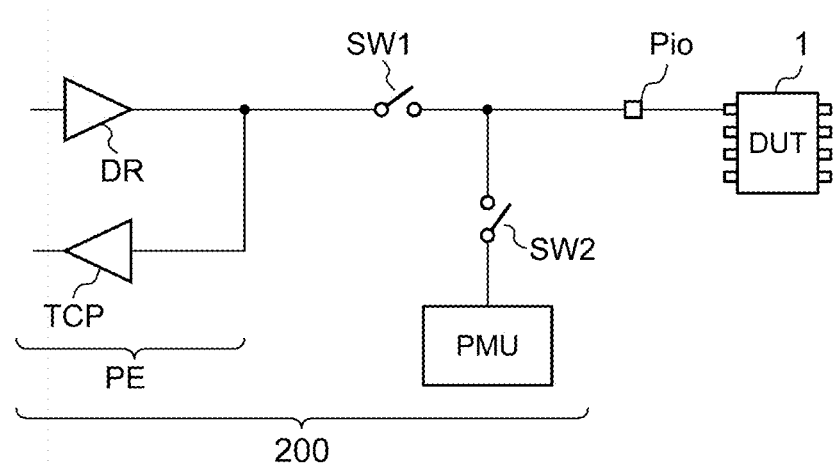
FIG. 1 is a diagram showing a typical configuration of a pin card.
Figure 2:
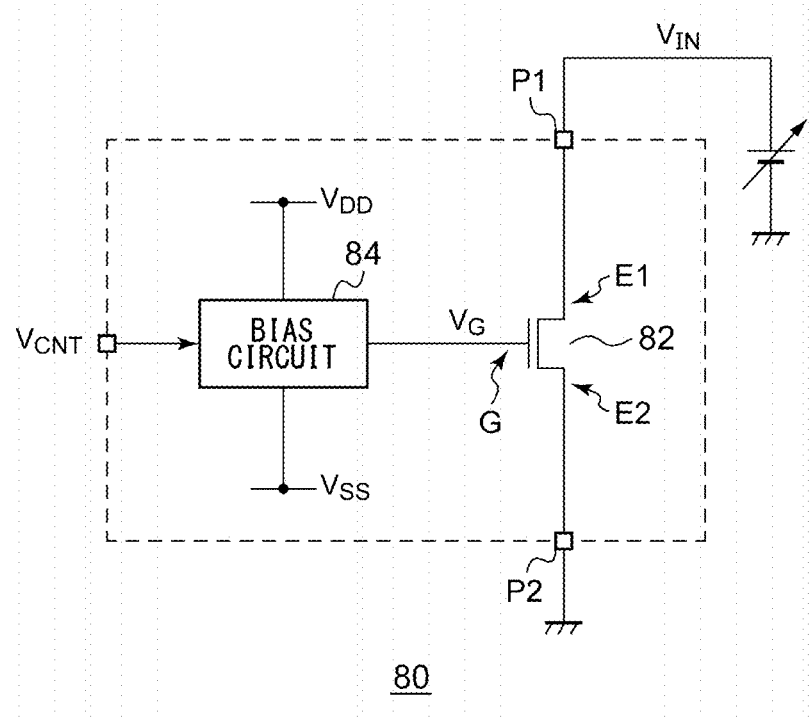
FIG. 2 is a circuit diagram showing a semiconductor switch investigated by the present inventors.

Lastly, description will be made regarding the usage of the semiconductor switch 10. The semiconductor switch 10 is preferably employed as the switches SW1 and SW2 of the pin card 200 shown in FIG. 1.

Also, multiple semiconductor switches 10 may be combined so as to provide a selector or a multiplexer.

FIGS. 7A and 7B are circuit diagrams each showing a selector including the semiconductor switches 10. A selector 50a shown in FIG. 7A is configured as a single-input/N-output selector. The selector 50a includes multiple, i.e., N semiconductor switches 10_1 through 10_N arranged such that their first terminals P1 are each connected to a common input terminal IN. The second terminals P2 of the multiple semiconductor switches 10_1 through 10_N are connected to the corresponding output terminals OUT1 through OUTN, respectively. FIG. 7A shows an SP3T (Single Pole Triple Throw) switch configured such that N=3. Also, the present invention is applicable to an SPDT (Single Pole Double Throw) switch configured such that N=2, an SP4T configured such that N=4, and the like.

A selector 50b shown in FIG. 7B is configured as an N-input/single-output selector. The selector 50b includes multiple, i.e., N semiconductor switches 10_1 through 10_N arranged such that their second terminals P2 are each connected to a common output terminal OUT. The first terminals P1 of the multiple semiconductor switches 10_1 through 10_N are connected to the corresponding input terminals IN1 through INN, respectively. FIG. 7B shows a DPST (Dual Pole Single Throw) switch configured such that N=2. Also, the present invention is applicable to a 3PST (Triple Pole Single Throw) switch configured such that N=3, a 4PST configured such that N=4, and the like.

The selectors 50a and 50b shown in FIGS. 7A and 7B may preferably be employed as a pin switch of a semiconductor test apparatus.

While the preferred embodiments of the present invention have been described using specific terms, such description is for illustrative purposes only, and it is to be understood that changes and variations may be made without departing from the spirit or scope of the appended claims.

What is claimed is:

1. A semiconductor switch having its first terminal and its second terminal, and configured to conduct or cutoff a signal path from its first terminal to its second terminal, the semiconductor switch comprising:
    an enhancement-type first transistor arranged between the first terminal and the second terminal;
    a first bias circuit connected to apply a gate voltage that corresponds to a control signal to a gate of the first transistor when a power supply voltage is supplied; and
    a second bias circuit connected to apply, to the gate of the first transistor, a voltage that corresponds to a lower voltage selected from among voltages at the first terminal and the second terminal, in a no-power-supply state in which the power supply voltage is not supplied.

2. The semiconductor switch according to claim 1, wherein the second bias circuit comprises:
    a gate circuit that passes voltages at the first terminal and the second terminal in the no-power-supply state; and
    a comparator circuit that applies, to the gate of the first transistor, a voltage that corresponds to a lower voltage selected from among the voltages at the first terminal and the second terminal.

3. The semiconductor switch according to claim 2, wherein the gate circuit comprises:
    a second transistor having its first electrode connected to the first terminal, its second electrode, and its gate biased so as to turn on the second transistor in the no-power-supply state; and
    a third transistor having its first electrode connected to the second terminal, its second electrode, and its gate biased so as to turn on the third transistor in the no-power-supply state,
    and wherein the comparator circuit selects a lower voltage from among the voltage at the second electrode of the second transistor and the voltage at the second electrode of the third transistor, and applies a voltage that corresponds to the selected voltage to the gate of the first transistor.

4. The semiconductor switch according to claim 3, wherein the second transistor and the third transistor are each configured as a depression-type transistor,
    and wherein the gates of the second transistor and the third transistor are each connected to a power supply line to which a lower-side power supply voltage is supplied, and are each connected to a ground line via a resistor.

5. The semiconductor switch according to claim 3, wherein the comparator circuit comprises:
    a first diode having its cathode connected to the second electrode of the second transistor, and its anode connected to the gate of the first transistor; and
    a second diode having its cathode connected to the second electrode of the third transistor, and its anode connected to the gate of the first transistor.

6. The semiconductor switch according to claim 1, wherein the first bias circuit adjusts the gate voltage of the first transistor according to the voltage at the first terminal and the voltage at the second terminal.

7. The semiconductor switch according to claim 1, wherein the first bias circuit comprises:
- a tracking circuit that generates a tracking voltage that follows the voltage at the first terminal and the voltage at the second terminal; and
- a level shifter that shifts the level of the control signal in a binary manner to a high level voltage that corresponds to the tracking voltage or otherwise to a predetermined low level voltage.

8. A test apparatus comprising a semiconductor switch, wherein the semiconductor switch has its first terminal and its second terminal, and is configured to conduct or cutoff a signal path from its first terminal to its second terminal, and wherein the semiconductor switch comprises:
- an enhancement-type first transistor arranged between the first terminal and the second terminal;
- a first bias circuit connected to apply a gate voltage that corresponds to a control signal to a gate of the first transistor when a power supply voltage is supplied; and
- a second bias circuit connected to apply, to the gate of the first transistor, a voltage that corresponds to a lower voltage selected from among voltages at the first terminal and the second terminal, in a no-power-supply state in which the power supply voltage is not supplied.

* * * * *